United States Patent
Wang et al.

(10) Patent No.: US 8,658,506 B1
(45) Date of Patent: Feb. 25, 2014

(54) METHOD AND APPARATUS FOR SELECTIVELY IMPROVING INTEGRATED DEVICE PERFORMANCE

(75) Inventors: Zhongze Wang, San Diego, CA (US); Choh fei Yeap, San Diego, CA (US); Ping Liu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/328,912

(22) Filed: Dec. 16, 2011

Related U.S. Application Data

(60) Provisional application No. 61/472,449, filed on Apr. 6, 2011.

(51) Int. Cl.
*H01L 21/336* (2006.01)

(52) U.S. Cl.
USPC ........... 438/301; 438/302; 438/303; 438/305; 438/306; 257/E21.618; 257/E21.633

(58) Field of Classification Search
USPC ........... 257/E21.618, E21.633; 438/301–303, 438/305, 306
See application file for complete search history.

(56) References Cited

U.S. PATENT DOCUMENTS

| | | | |
|---|---|---|---|
| 5,837,587 A * | 11/1998 | Wei | 438/305 |
| 6,168,999 B1 * | 1/2001 | Xiang et al. | 438/286 |
| 7,488,635 B2 | 2/2009 | Winstead et al. | |
| 7,811,876 B2 | 10/2010 | Scott et al. | |
| 2007/0042579 A1 * | 2/2007 | Runyon et al. | 438/520 |
| 2009/0134468 A1 | 5/2009 | Tsuchiya et al. | |
| 2009/0218633 A1 | 9/2009 | Hoentschel et al. | |
| 2010/0308415 A1 | 12/2010 | Herberholz et al. | |

* cited by examiner

*Primary Examiner* — Zandra Smith
*Assistant Examiner* — Paul Patton
(74) *Attorney, Agent, or Firm* — Peter Michael Kamarchik; Nicholas J. Pauley; Joseph Agusta

(57) ABSTRACT

Methods and apparatus for selectively improving integrated circuit performance are provided. In an example, a method is provided that includes defining a critical portion of an integrated circuit layout that determines the speed of an integrated circuit, identifying at least a part of the critical portion that includes at least one of a halo, lightly doped drain (LDD), and source drain extension (SDE) implant region, and performing a speed push flow process to increase performance of the part of the critical portion that includes the at least one of the halo, the LDD, and the SDE implant region. The resultant integrated circuit can be integrated with a mobile device.

15 Claims, 12 Drawing Sheets

METHOD AND APPARATUS FOR SELECTIVELY IMPROVING INTEGRATED DEVICE PERFORMANCE

RELATED APPLICATIONS

The present application for patent claims priority to U.S. Provisional Application No. 61/472,449, entitled "METHOD AND APPARATUS FOR SELECTIVELY IMPROVING INTEGRATED DEVICE PERFORMANCE," filed Apr. 6, 2011 and assigned to the assignee hereof and hereby expressly incorporated by reference herein.

TECHNICAL FIELD

This disclosure relates generally to electronics, and more specifically, but not exclusively, to apparatus and methods for selectively improving integrated device performance.

BACKGROUND

In mobile systems-on-a-chip (SOC), chip performance is becoming increasingly important to benchmark against competition. The traditional approach is to design an integrated circuit (IC) using transistor models and simulate it at certain voltage, temperature, and process corners to ensure the IC meets certain performance criteria. Once design is complete, the IC is manufactured according to the transistor specifications used by the design. Thus, performance of the IC is fixed at the design operating conditions. However, customers continuously demand improvements in IC performance. It is highly desirable to have an IC that outperforms a competitor's product to differentiate over competitor devices. Conventional methods dictate that product improvement requires redesigning the entire IC. However, redesigning the entire IC requires very high reengineering costs and long cycle times. What is needed are IC design and fabrication techniques that increase IC performance without sacrificing standby (i.e., sleep-mode) leakage, and without requiring repetitive redesign of the entire IC.

Accordingly, there are long-felt industry needs for methods and apparatus that mitigate problems of conventional methods and apparatus, including selectively improving IC performance.

SUMMARY

This summary provides a basic understanding of some aspects of the present teachings. This summary is not exhaustive in detail, and is neither intended to identify all critical features, nor intended to limit the scope of the claims.

Exemplary methods and apparatus for selectively improving integrated circuit performance are provided. In an example, a method includes defining a critical portion of an integrated circuit layout that determines the speed of the integrated circuit; identifying at least a part of the critical portion that includes at least one of a halo implant region, lightly doped drain (LDD) implant region, and source drain extension (SDE) implant region; and performing a speed push flow process to increase performance of the part of the critical portion that includes the at least one of the halo implant region, the LDD implant region, and the SDE implant region. The method can also include masking a first portion of the integrated circuit that includes the halo implant region and is outside the critical portion; implanting a first halo implant in the portion of the integrated circuit that includes the halo implant region and is inside the critical portion; masking a second portion of the integrated circuit that includes the halo implant region and is inside the critical portion; and implanting a second halo implant in the portion of the integrated circuit that includes the halo implant region and is outside the critical portion, where the second halo implant receives a higher dose of dopant than the first halo implant.

Furthermore, the method can also include fabricating a first portion of the integrated circuit that includes the halo implant region and is outside the critical portion with first polycrystalline silicon gates having a width based on a first critical dimension; and fabricating a second portion of the integrated circuit that includes the halo implant region and is inside the critical portion with second polycrystalline gates having a width based on a second critical dimension, where the first critical dimension is greater than the second critical dimension. Further, the method can also include fabricating a first portion of the integrated circuit that includes the halo implant region and is outside the critical portion with a first gate oxide layer having a first thickness; and fabricating a second portion of the integrated circuit that includes the halo implant region and is inside the critical portion second with a gate oxide layer having a second thickness, where the first thickness is greater than the second thickness.

Moreover, the method can include fabricating a first portion of the integrated circuit that includes the LDD implant region and is outside the critical portion with a first dopant concentration; and fabricating a second portion of the integrated circuit that includes the LDD implant region and is inside the critical portion with a second dopant concentration, where the first dopant concentration is less than the second dopant concentration. In another example, the method can also include fabricating a first portion of the integrated circuit that includes the SDE implant region and is outside the critical portion with a first dopant concentration; and fabricating a second portion of the integrated circuit that includes the SDE implant region and is inside the critical portion with a second dopant concentration, where the first dopant concentration is less than the second dopant concentration.

In a further example, provided is a non-transitory computer-readable medium, comprising instructions stored thereon that, if executed by a lithographic device, cause the lithographic device to execute at least a part of the aforementioned method.

In another example, provided is an apparatus configured to selectively improve integrated circuit performance. The apparatus includes means for defining a critical portion of an integrated circuit layout that determines the speed of the integrated circuit; means for identifying at least a part of the critical portion that includes at least one of a halo implant region, lightly doped drain (LDD) implant region, and source drain extension (SDE) implant region; and means for performing a speed push flow process to increase performance of the part of the critical portion that includes the at least one of the halo implant region, the LDD implant region, and the SDE implant region. The apparatus can also include means for masking a first portion of the integrated circuit that includes the halo implant region and is outside the critical portion; means for implanting a first halo implant in the portion of the integrated circuit that includes the halo implant region and is inside the critical portion; means for masking a second portion of the integrated circuit that includes the halo implant region and is inside the critical portion; and means for implanting a second halo implant in the portion of the integrated circuit that includes the halo implant region and is outside the critical portion, where the second halo implant receives a higher dose of dopant than the first halo implant.

The apparatus can also include means for fabricating a first portion of the integrated circuit that includes the halo implant region and is outside the critical portion with first polycrystalline silicon gates having a width based on a first critical dimension; and means for fabricating a second portion of the integrated circuit that includes the halo implant region and is inside the critical portion with second polycrystalline gates having a width based on a second critical dimension, where the first critical dimension is greater than the second critical dimension. Further, the apparatus can also include means for fabricating a first portion of the integrated circuit that includes the halo implant region and is outside the critical portion with a first gate oxide layer having a first thickness; and means for fabricating a second portion of the integrated circuit that includes the halo implant region and is inside the critical portion second with a gate oxide layer having a second thickness, where the first thickness is greater than the second thickness.

Furthermore, in an example, the apparatus includes means for fabricating a first portion of the integrated circuit that includes the LDD implant region and is outside the critical portion with a first dopant concentration; and means for fabricating a second portion of the integrated circuit that includes the LDD implant region and is inside the critical portion with a second dopant concentration, where the first dopant concentration is less than the second dopant concentration. Moreover, the apparatus can also include means for fabricating a first portion of the integrated circuit that includes the SDE implant region and is outside the critical portion with a first dopant concentration; and means for fabricating a second portion of the integrated circuit that includes the SDE implant region and is inside the critical portion with a second dopant concentration, where the first dopant concentration is less than the second dopant concentration.

In another example, provided is an integrated circuit fabricated according to an integrated circuit layout. The integrated circuit includes a critical portion of the integrated circuit layout that determines a speed of the integrated circuit, where at least a part of the critical portion includes at least one of a halo, lightly doped drain (LDD), and source drain extension (SDE) implant region; and a marker layer comprising the part of the critical portion that includes the at least one of the halo, the lightly doped drain (LDD), or the source drain extension (SDE) implant region, and that includes at least one transistor formed therefrom. In an example, a first transistor in the critical portion has a first halo implant, a second transistor outside of the critical portion has a second halo implant; and the first halo implant has a higher dopant concentration than the second halo implant. In another example, the first transistor in the critical portion includes a first polycrystalline silicon gate, and a second transistor outside of the critical portion has a second polycrystalline silicon gate, where the first polycrystalline silicon gate has a smaller critical dimension than the second polycrystalline silicon gate.

In a further example, a first transistor in the critical portion has a first gate oxide having a first thickness, a second transistor outside of the critical portion has a second gate oxide having a second thickness; and the first thickness is thinner than the second thickness. In another example, a first transistor in the critical portion has the LDD having a first dopant concentration, a second transistor outside of the critical portion has a second LDD having a second dopant concentration; and the first dopant concentration is greater than the second dopant concentration. In another example, a first transistor in the critical portion has an SDE implant having a first dopant concentration, a second transistor outside of the critical portion has a second SDE implant having a second dopant concentration; and the first dopant concentration is greater than the second dopant concentration.

At least a part of the integrated circuit can be integrated in a semiconductor die. Further, at least a part of the integrated circuit can be integrated with a mobile device. In a further example, provided is a non-transitory computer-readable medium, comprising instructions stored thereon that, if executed by a lithographic device, cause the lithographic device to fabricate at least a part of the integrated circuit.

The foregoing broadly outlines some of the features and technical advantages of the present teachings in order that the detailed description and drawings can be better understood. Additional features and advantages are also described in the detailed description. The conception and disclosed embodiments can be readily utilized as a basis for modifying or designing other structures for carrying out the same purposes of the present teachings. Such equivalent constructions do not depart from the technology of the teachings as set forth in the claims. The novel features that are characteristic of the teachings, together with further objects and advantages, are better understood from the detailed description and the accompanying figures. Each of the drawings is provided for the purpose of illustration and description only, and does not limit the present teachings.

BRIEF DESCRIPTION OF THE DRAWINGS

The accompanying drawings are presented to describe examples of the present teachings, and are not provided as limitations.

Figure 1:
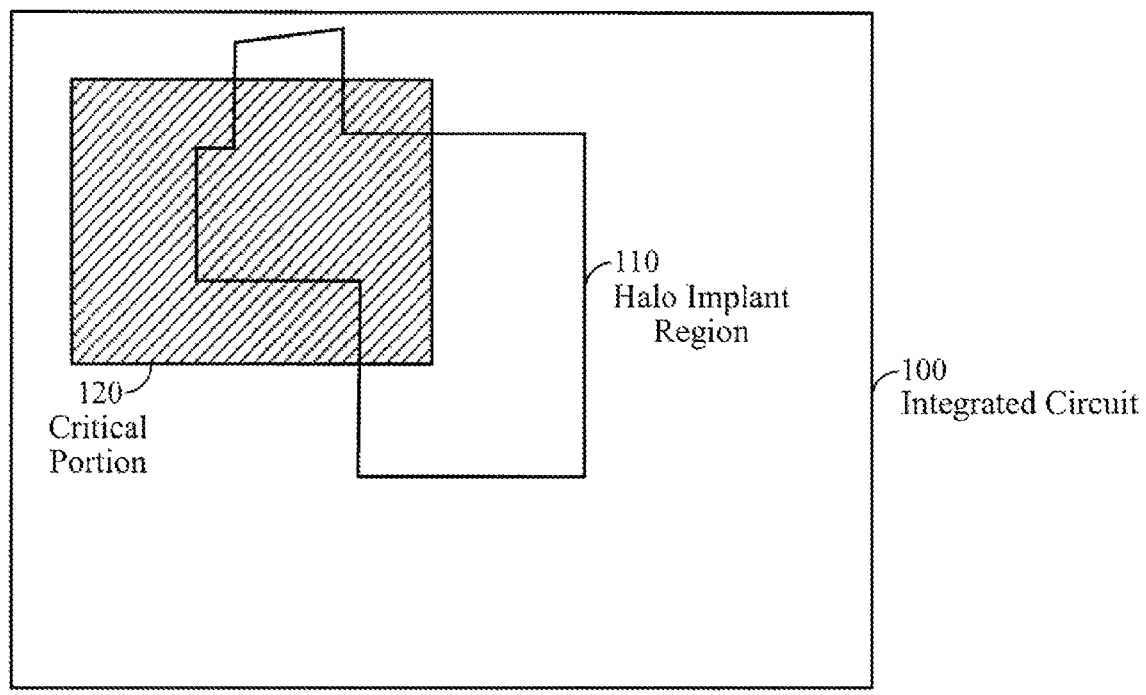
FIG. 1 depicts an exemplary n-channel transistor halo implant in an integrated circuit.

The features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Examples of the current teachings are disclosed in this application's text and drawings. The examples advantageously address the long-felt industry needs, as well as other previously unidentified needs, and mitigate shortcomings of the conventional methods and apparatus. Alternate embodiments can be devised without departing from the scope of the invention. Additionally, conventional elements of the current teachings may not be described in detail, or may be omitted, to avoid obscuring aspects of the current teachings.

The word "exemplary" is used herein to mean "serving as an example, instance, or illustration." Any embodiment described as "exemplary" is not necessarily to be construed as preferred or advantageous over other embodiments. Likewise, the term "embodiments of the invention" does not require that all embodiments of the invention include the discussed feature, advantage, or mode of operation. Use of the terms "in one example," "an example," "in one feature," and/or "a feature" in this specification does not necessarily refer to the same feature and/or example. Furthermore, a particular feature and/or structure can be combined with one or more other features and/or structures.

It should be noted that the terms "connected," "coupled," or any variant thereof, mean any connection or coupling, either direct or indirect, between two or more elements, and can encompass the presence of one or more intermediate elements between two elements that are "connected" or "coupled" together. The coupling or connection between the elements can be physical, logical, or a combination thereof. As employed herein two elements can be considered to be "connected" or "coupled" together by the use of one or more wires, cables, and/or printed electrical connections, as well as by the use of electromagnetic energy, such as electromagnetic energy having wavelengths in the radio frequency region, the microwave region and/or the optical (both visible and invisible) region, as several non-limiting and non-exhaustive examples.

It should be understood that the term "signal" can include any signal such as a data signal, audio signal, video signal, multimedia signal. Information and signals can be represented using any of a variety of different technologies and techniques. For example, data, instructions, process step, commands, information, signals, bits, symbols, and chips that can be referenced throughout this description can be represented by voltages, currents, electromagnetic waves, magnetic fields or particles, optical fields or particles, and/or any combination thereof.

It should be understood that any reference to an element herein using a designation such as "first," "second," and so forth does not generally limit the quantity or order of those elements. Rather, these designations can be used herein as a convenient method of distinguishing between two or more elements or instances of an element. Thus, a reference to first and second elements does not mean that only two elements can be employed, or that the first element must necessarily precede the second element. Also, unless stated otherwise, a set of elements can comprise one or more elements. In addition, terminology of the form "at least one of: A, B, or C" used in the description or the claims means "A or B or C or any combination of these elements."

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

In the following description, certain terminology is used to describe certain features. The term "mobile device" includes, but is not limited to, a mobile phone, a mobile communication device, personal digital assistant, mobile palm-held computer, a wireless device, and/or other types of portable electronic devices typically carried by a person and/or having some form of communication capabilities (e.g., wireless, infrared, short-range radio, etc.).

Methods and apparatus for selectively improving integrated circuit performance are provided. In an example, a method is provided that includes defining a critical portion of an integrated circuit layout that determines the speed of an integrated circuit, identifying at least a part of the critical portion that includes at least one of a halo implant region (i.e., a pocket implant), lightly doped drain (LDD), or source drain extension (SDE) implant region, and performing a speed push flow process to increase performance of the part of the critical portion that includes the at least one of the halo, the LDD, and the SDE implant region.

The disclosed methods and apparatus improve selected transistors in a chip design to achieve higher performance. The disclosed methods and apparatus provide several advantages. For example, processor performance can be increased significantly higher in a subsequent design than in an original design, without increasing leakage current during a power saving mode. Compared to the conventional circuit redesign approach to improve circuit performance, the disclosed methods and apparatus have nearly zero turnaround time and can be implemented on the fly, while conventional redesigning takes months and consumes expensive engineering resources. Compared to traditional approaches, such as lowering a transistor threshold voltage (Vt) globally (i.e., for the entire integrated circuit), the disclosed methods and apparatus have much lower standby current leakage during the power saving mode, which is a very important feature enhancement for mobile devices.

FIG. 1 depicts an exemplary integrated circuit (IC) 100. The IC 100 has an n-channel transistor (nch) halo implant region 110 and a critical portion 120. In the example depicted in FIG. 1, the critical portion 120 is depicted as a region in the IC 100 that includes a portion of the halo implant region 110. A region of the IC 100 that is not in the critical portion 120 also includes a portion of the halo implant region 110. In an example, the halo implant region 110 can include at least one of a lightly doped drain (LDD) implant region and source drain extension (SDE) implant region. The depictions in FIG. 1 are examples, and are not limiting of the devices and methods described herein.

A halo region, such as the halo implant region 110, is a thin, heavily-doped region of a metal-oxide-silicon field effect transistor (MOSFET) body. The halo region has the same dopant as the MOSFET body, and is located adjacent to the MOSFET's source-gate and drain-gate junctions. The halo implant is often implanted adjacent to a source drain extension (SDE) implant and/or a lightly doped drain (LDD) implant. The halo region provides a benefit of limiting an extent of depletion regions of the MOSFET's source-gate and drain-gate junctions, as well as improving the MOSFET's short-channel behavior. The halo implant also reduces a threshold voltage (Vt) roll-off in short-channel devices. A higher halo implant dose raises the MOSFETs Vt, which lowers the MOSFET's performance. In further examples, a region including an LDD and/or a SDE implant region can take the place of the halo implant region 110.

The critical portion 120 is a portion of the IC 100 that determines a limiting speed of the IC 100. Transistors inside the critical portion 120 can play the most significant role in determining the performance of the IC 100. The critical portion can be a path in the IC 100 that limits a speed of information flow. Further, the circuits in the critical portion 120 can be capable of powering down during a power-saving mode (e.g., a sleep mode). During the power saving mode, the critical path circuit in the critical portion 120 can be powered down, thus any current leakage in the transistors in the critical portion 120 does not impact leakage-based power loss in the power saving mode.

For example, the critical portion 120 can be at least a portion of a processor core. In another example, the critical portion can be at least a portion of an interface circuit (e.g., a network interface, a memory interface, and/or a peripheral interface), at least a portion of a memory, at least a portion of a video display controller, at least a portion of a transmitter, and/or at least a portion of a receiver.

Performance of the portion of the critical portion 120 that includes the halo implant region 110 can be selectively improved with a speed push flow process. This region is depicted in FIG. 1 as being located within both the critical portion 120 and the halo implant region 110.

A speed push flow process is a combination of circuit design and fabrication techniques that improves the performance of a portion of the IC 100, such as the critical portion 120. Performance increases can include, and are not limited to, increasing circuit speed and reducing a circuit slew rate.

In an example, the critical portion 120 (e.g., critical speed path) of the IC 100 is identified during a design process. Further, a design hold time margin at beyond three-sigma process corners is verified. This guarantees functionality of the IC 100 when a speed of the transistors in the IC 100 is later increased. Next, a design marker layer that covers substantially all transistors in the critical portion 120 is provided. During fabrication, a performance boosting process is performed on selected transistors within the critical portion 120. There are many ways of boosting circuit performance, such as the speed push flow circuit design and fabrication techniques that are described in each of FIGS. 2, 4, and 6A-6B.

Figure 2:
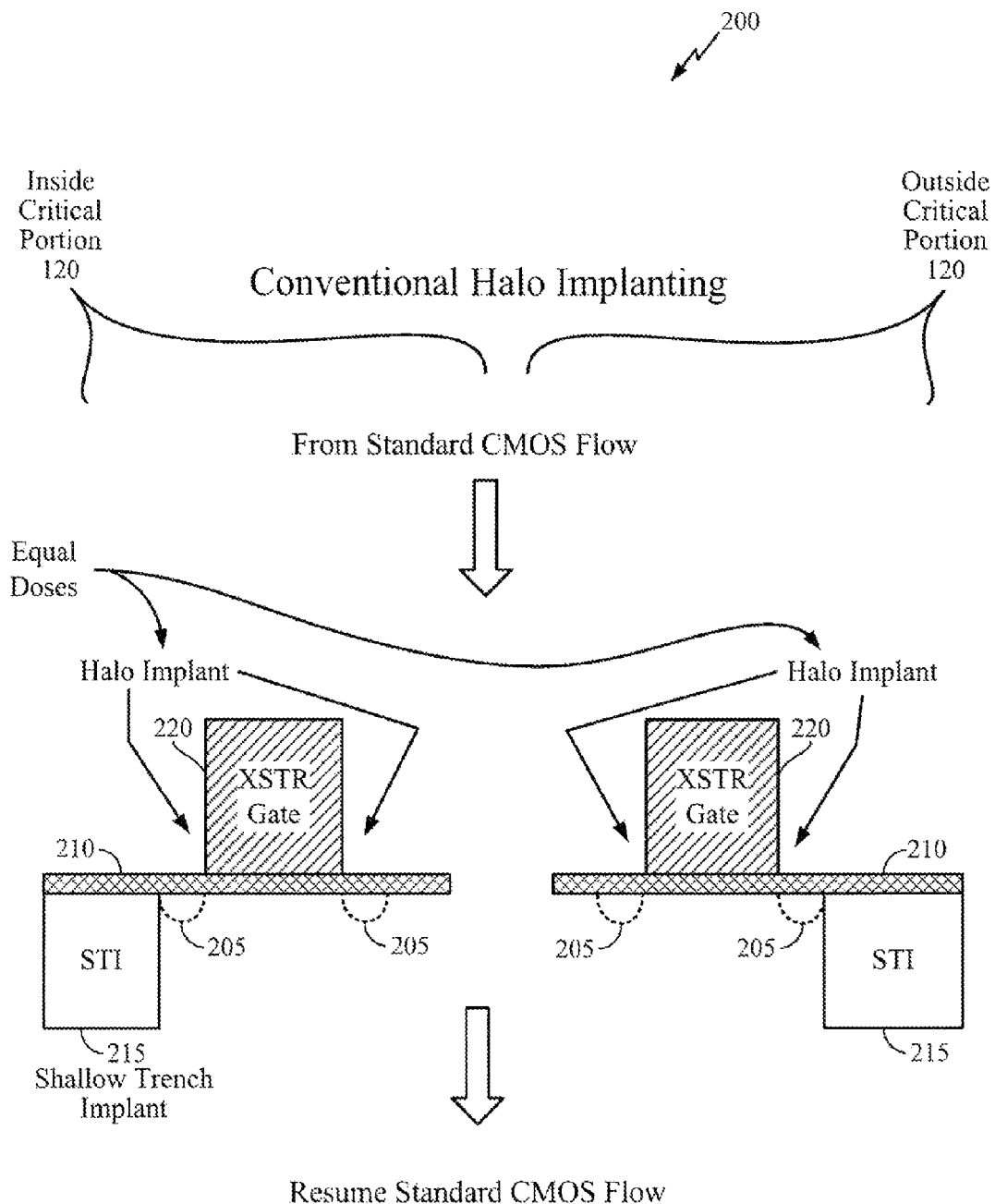
FIG. 2 depicts a typical n-channel transistor halo implant process.

FIG. 2 depicts a typical nch halo implant process 200. In the typical nch halo implant process 200, halo implants 205 are fabricated on a substrate 210 with equal doses of dopant. The halo implants 205 are fabricated between a shallow trench implant 215 and a transistor gate 220. Thus, transistors inside and outside the critical portion 120 have nch halo implants with equivalent doping.

Figure 3:
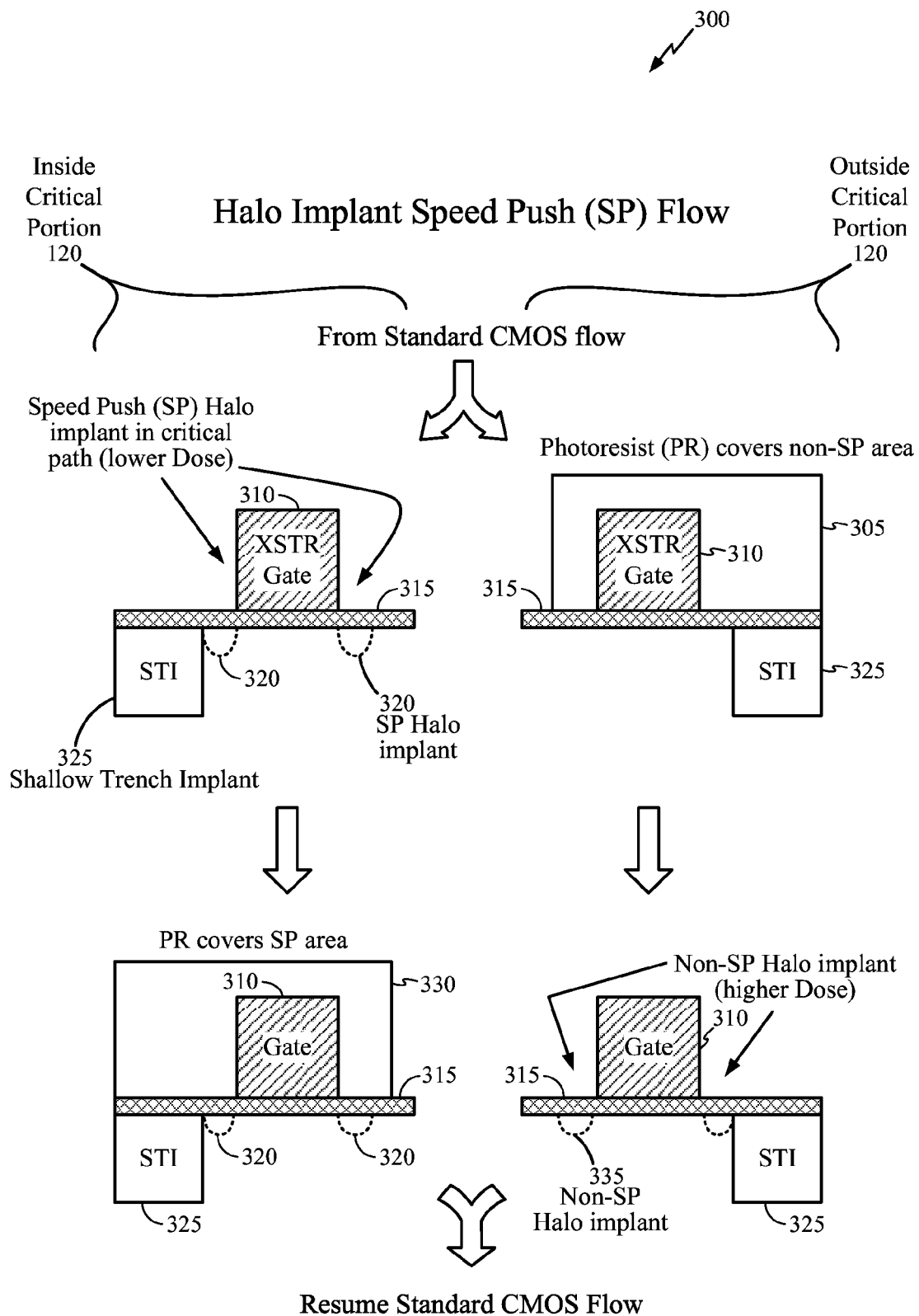
FIG. 3 depicts an exemplary n-channel transistor halo implant speed push flow process.

FIG. 3 depicts an exemplary nch halo implant speed push flow process 300. The exemplary nch halo implant speed push flow process 300 can be used to fabricate a p-channel transistor (pch) as well. In the speed push flow process 300, separate implant masks are created for transistors inside and outside the critical portion 120.

In the nch halo implant speed push flow process 300, initially, a fabrication process departs from a standard process flow (i.e., a CMOS process). A first photoresist (PR) 305 is deposited on transistor gates 310 on a substrate 315. A lithography step is used to pattern the first PR 305 so that the first PR 305 remains outside of the critical portion 120 (i.e., the non-speed push area). Then, a lower implant dose than that used in the standard CMOS flow fabricates first halo implants 320 inside the critical portion 120. The first halo implants 320 can be fabricated between a shallow trench implant 325 and a transistor gate 310. Fabricating the first halo implants 320 with a lower implant dose improves performance of the transistors in the critical portion 120 over that of transistors outside the critical portion 120. This process can be performed for both n-channel transistors and p-channel transistors. Thus, nch transistors and pch transistors in the critical portion 120 have a higher performance (e.g., critical circuit path performance) than devices outside of the critical portion 120. Next, the first PR 305 is stripped from the regions outside of the critical portion 120. A second PR layer 330 is deposited on the transistor gates 310 on the substrate 315. A lithography step patterns the second PR layer 330 so that the second PR layer 330 covers the critical portion 120. Second halo implants 335 outside the critical portion 120 are fabricated using a typical implant dosage (i.e., a higher dose than that used to fabricate the first halo implants). The second PR layer 330 is then stripped from the critical portion 120, and the standard CMOS fabrication process continues.

Figure 4:
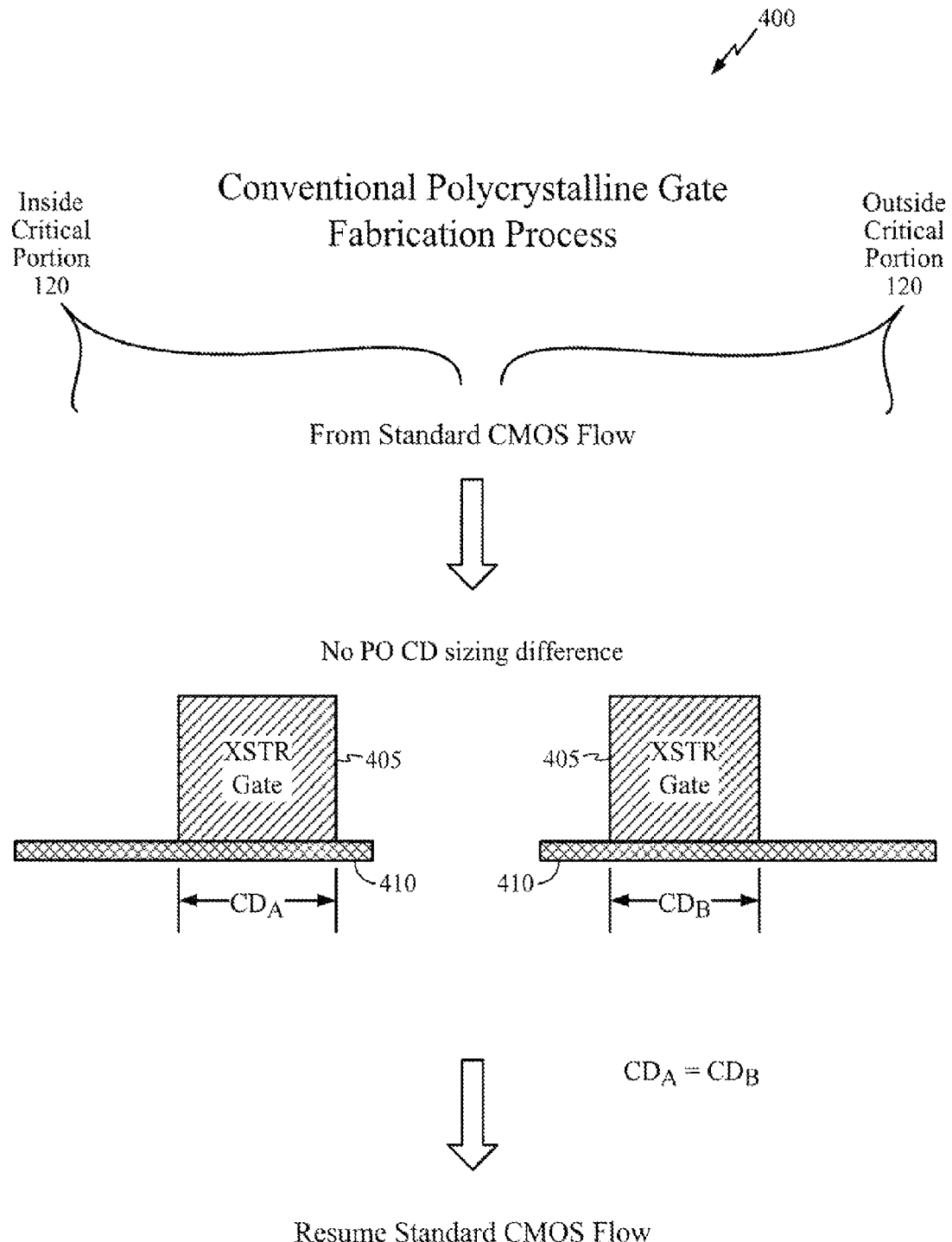
FIG. 4 depicts a typical polycrystalline gate fabrication process.

FIG. 4 depicts a typical polycrystalline Si gate fabrication process 400. In the typical polycrystalline Si gate fabrication process 400, transistor gates 405 inside and outside the critical portion 120, and on a substrate 410, are fabricated with the same polycrystalline Si gate (PO) critical dimension (CD).

Figure 5:
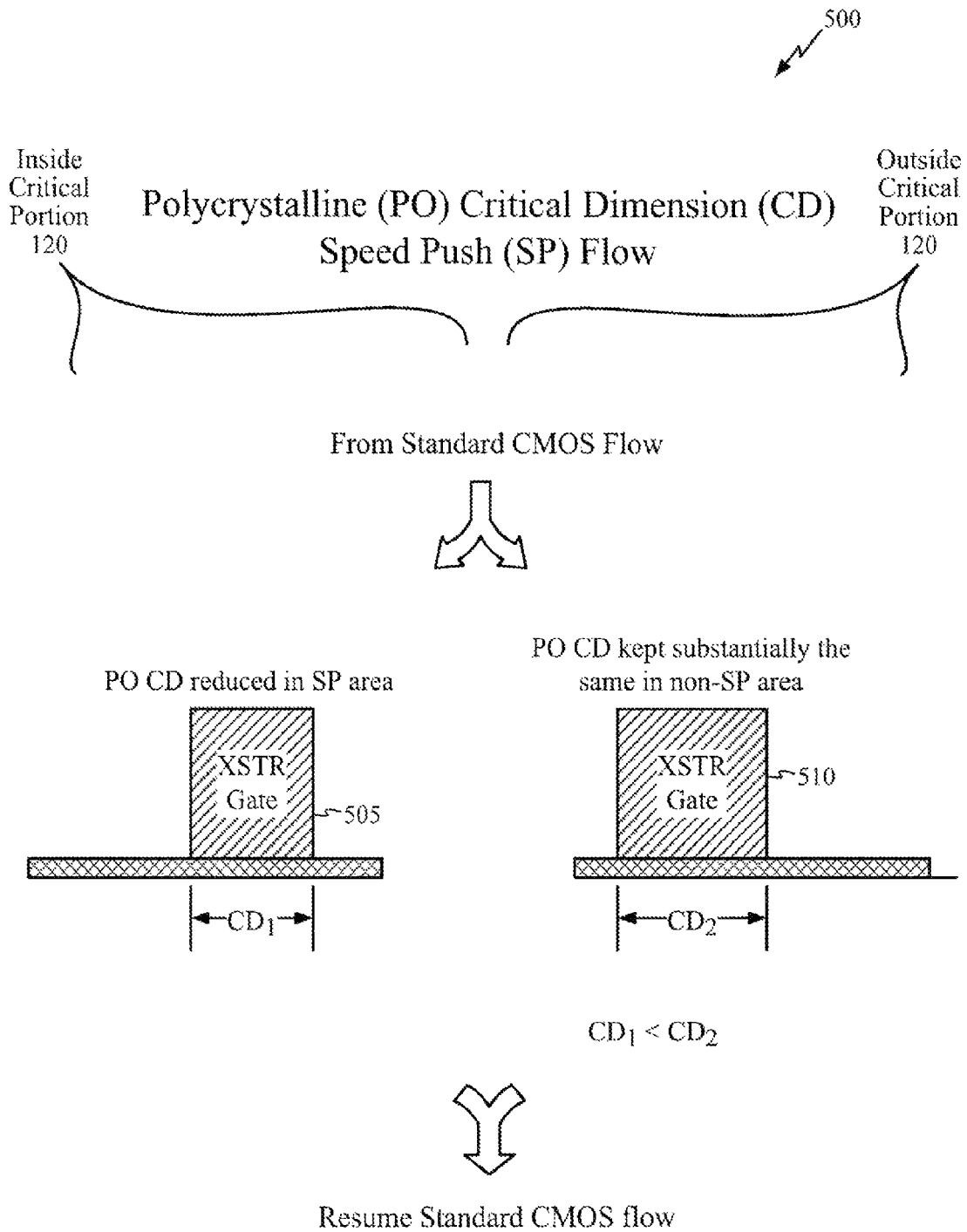
FIG. 5 depicts an exemplary polycrystalline gate critical dimension speed push flow process.

FIG. 5 depicts an exemplary PO CD speed push flow process 500. In the PO CD speed push flow process 500, transistors inside and outside the critical portion 120 are fabricated based on different POCD.

In the PO CD speed push flow process 500, initially, the fabrication process departs from the standard CMOS process flow. A dual-CD photo lithography mask is used to pattern a first poly Si gate 505 for devices inside the critical portion 120 and to a pattern a second poly Si gate 510 for devices outside the critical portion 120. The first poly Si gate 505 and the second poly Si gate 510 are fabricated on a substrate 515. The dual-CD photo lithography mask has a first portion with a standard PO CD to fabricate devices outside the critical portion 120 (i.e., the non-speed push area), and a second portion with a PO CD smaller than the typical CMOS process to fabricate the devices inside of the critical portion 120 (i.e., the speed push area). This process can be performed for both n-channel transistors (nch) and p-channel transistors (pch), and changes the channel lengths of the nch transistors and the pch transistors. The result is that the transistor channel length for transistors inside critical portion 120 is smaller than that for transistors outside the critical portion, which results in higher transistor performance inside critical portion 120 than would result if the same CD is used to fabricate transistors both inside and outside the critical portion 120. After fabrication of the integrated circuit with the dual-CD photo lithography mask, the standard CMOS fabrication processes continue.

Figure 6:
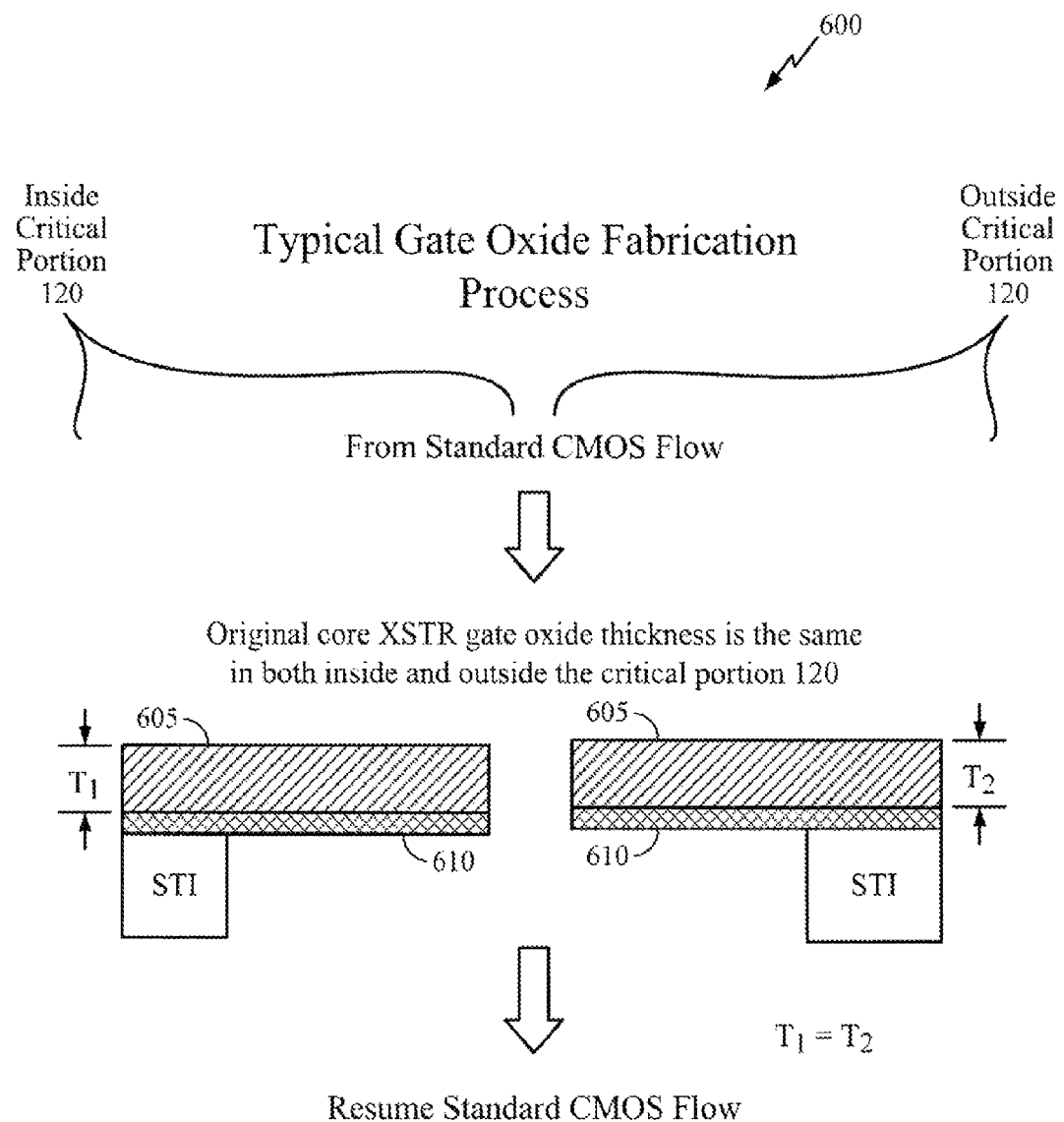
FIG. 6 depicts a typical gate oxide fabrication process.

FIG. 6 depicts a typical gate oxide fabrication process 600. In the typical gate oxide fabrication process 600, devices inside and outside the critical portion 120 in the typical integrated circuit are fabricated with a gate oxide 605 having a uniform thickness. The gate oxide 605 is located on a substrate 610.

Figure 7A:
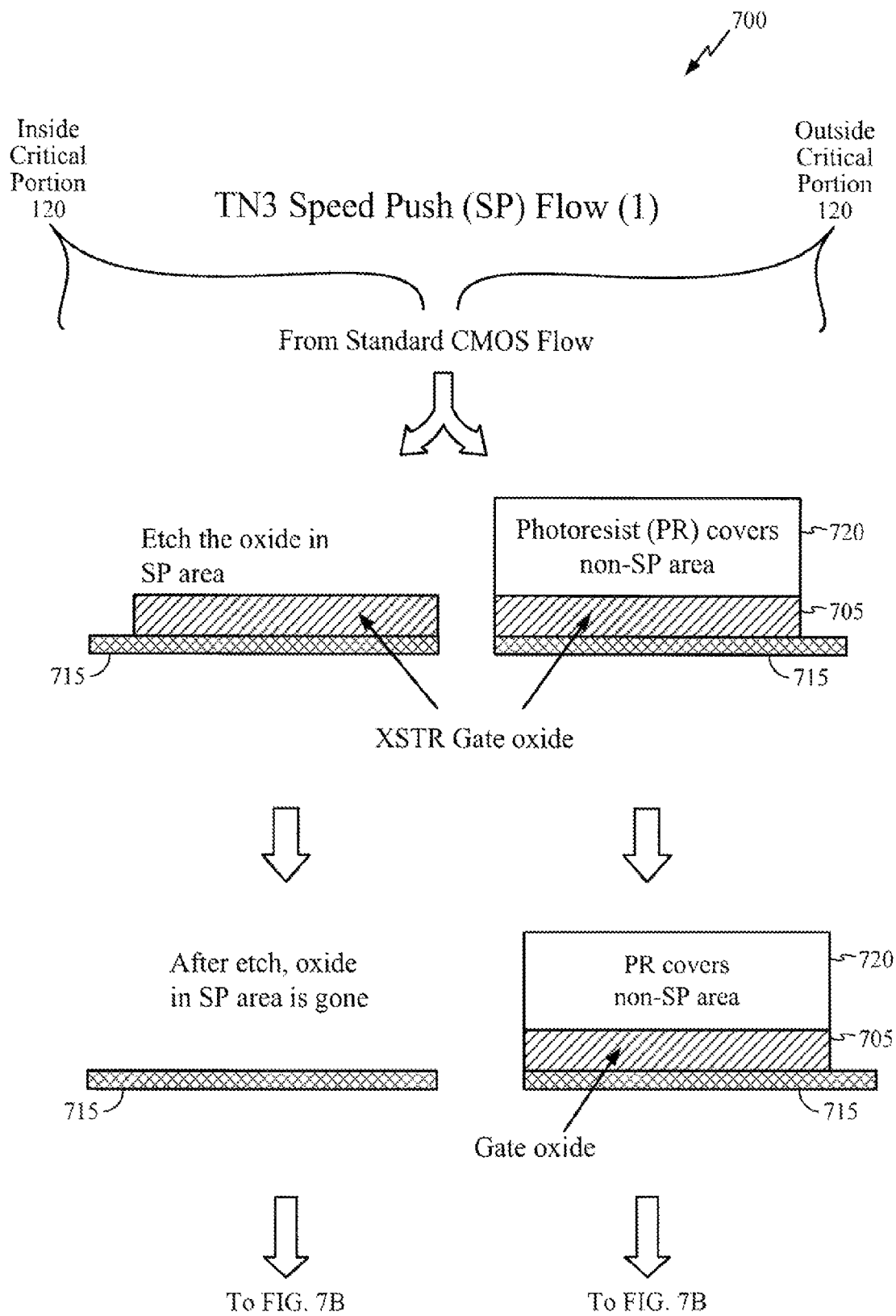
FIGS. 7A-B depict an exemplary gate oxide speed push flow process.
Figure 7B:
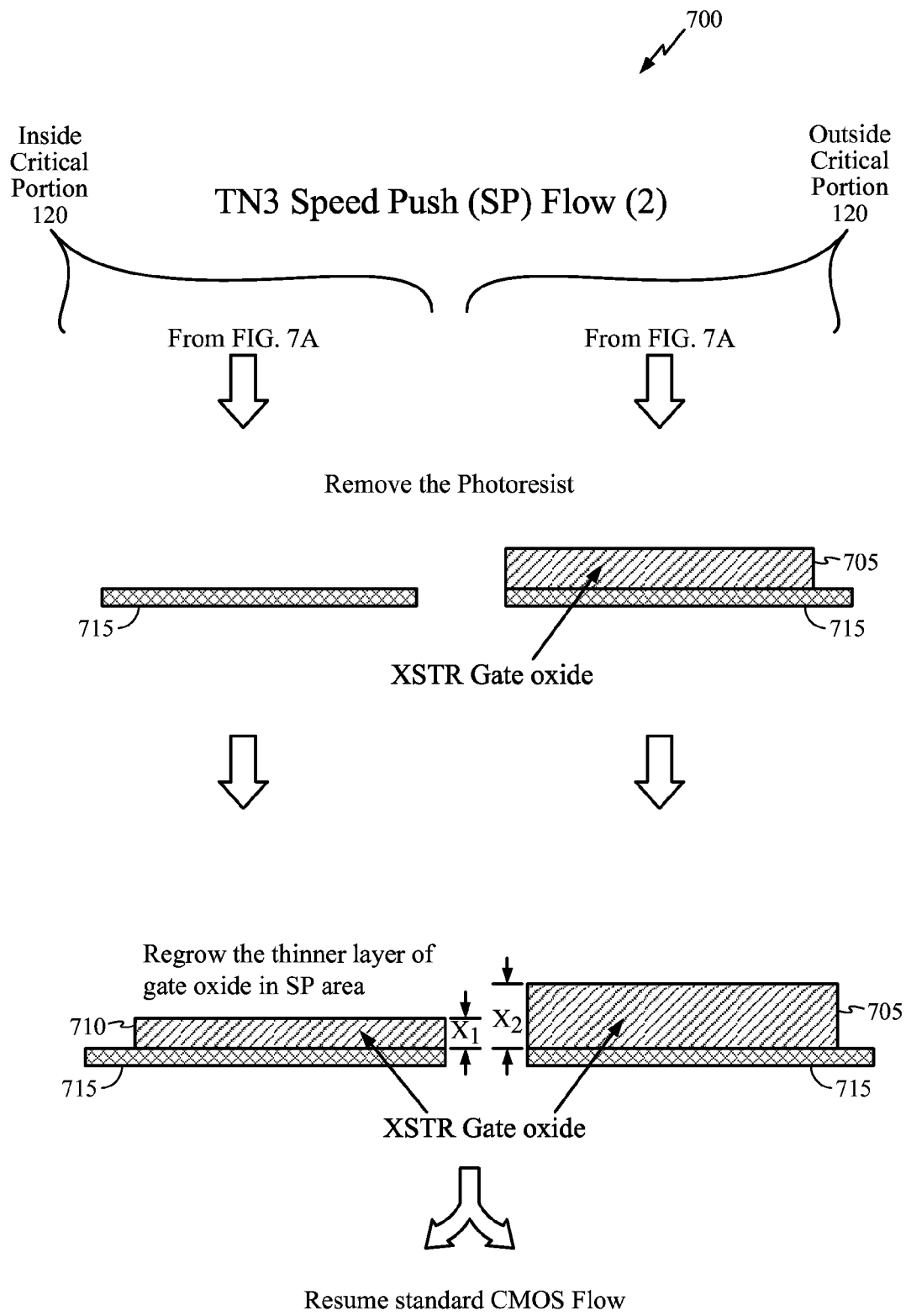

FIGS. 7A-B depict an exemplary gate oxide speed push flow process 700. In the gate oxide speed push flow process 700, transistors inside and outside the critical portion 120 are fabricated with different gate oxide thicknesses. The speed push flow process 700 uses a first mask to fabricate a thicker gate oxide layer 705 for selected transistors outside the critical portion 120. A second mask is used, based on a gds marker layer in the critical portion 120, to fabricate a thinner gate oxide layer 710 (e.g., a TN3 layer) for selected transistors in the critical portion 120. The thicker gate oxide layer 705 and the thinner gate oxide layer 710 are fabricated on a substrate 715.

Initially, the fabrication process departs from the standard CMOS process flow. A first oxide layer (which forms a transistor gate) is grown for devices both inside the critical portion 120 and outside the critical portion 120. A photoresist (PR) layer 720 is deposited on the first oxide layer. Then, photolithography is used to pattern the PR layer 720 so that the PR layer 720 covers a portion of the first oxide layer that is outside of the critical portion 120 (i.e., the non-speed push area), and does not cover a portion of the first oxide layer that is inside of the critical portion 120 (i.e., the speed push area).

Subsequently, at least a portion of the first oxide layer in the critical portion 120 is removed (e.g., by wet HF etching, etc.). Further, a second oxide layer that is thinner than that of typical process is grown inside the critical portion 120. As a result of this process, devices in the critical portion 120 have a gate oxide layer that is thinner than devices outside of the critical portion 120. After fabrication of the first and second oxide layers, the standard CMOS fabrication processes continue.

FIGS. 8A-8F depict exemplary methods for selectively improving integrated circuit performance 800. The method for selectively improving integrated circuit performance can be performed by the apparatus described hereby, such as a lithographic device configured to perform at least a part of the methods described hereby. In examples, the steps need not necessarily be performed in the order described.

In step 802, a critical portion of an integrated circuit layout that determines the speed of the integrated circuit is defined. In step 804, at least a part of the critical portion that includes at least one of a halo, lightly doped drain (LDD), and source drain extension (SDE) implant region is identified. In step 806, a speed push flow process is performed to increase performance of the part of the critical portion that includes the at least one of the halo, the LDD, and the SDE implant region. In optional step 808, proceed to steps described in FIGS. 8B-8F.

Figure 8A:
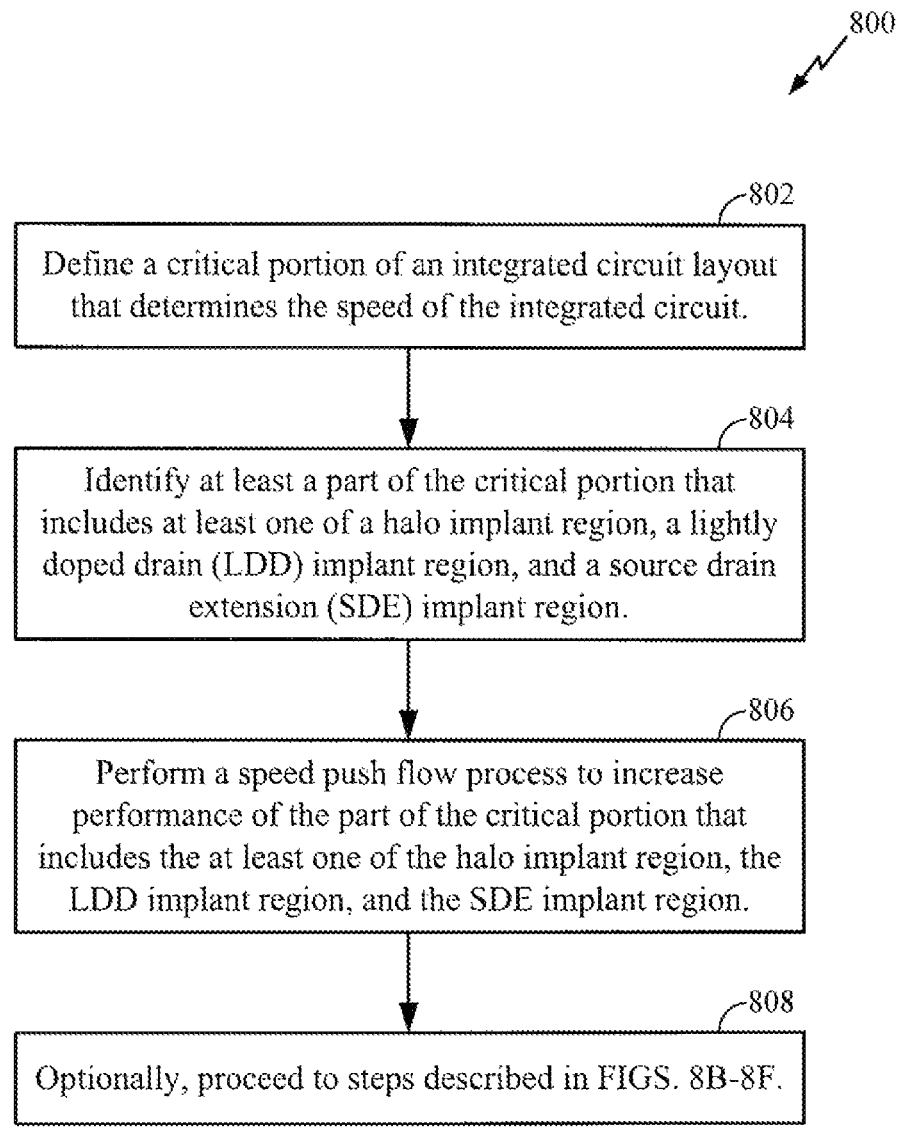
FIGS. 8A-8F depict exemplary methods for selectively improving integrated circuit performance.
Figure 8B:
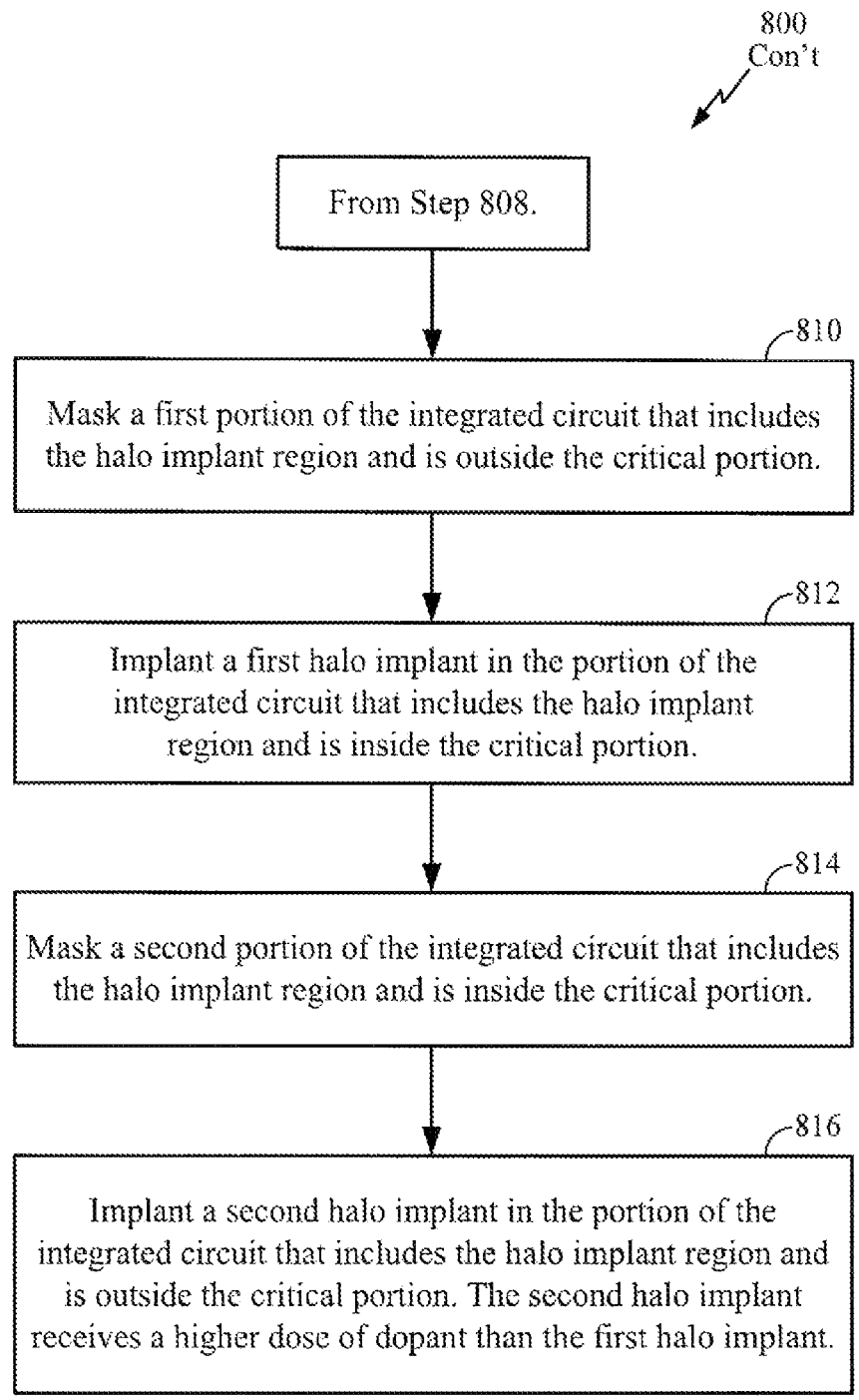

Referring to FIG. 8B, in step 810, a first portion of the integrated circuit that includes the halo implant region and is outside the critical portion is masked. In step 812, a first halo implant is implanted in the portion of the integrated circuit that includes the halo implant region and is inside the critical portion. In step 814, a second portion of the integrated circuit that includes the halo implant region and is inside the critical portion is masked. In step 816, a second halo implant in the portion of the integrated circuit that includes the halo implant region and is outside the critical portion is implanted. The second halo implant receives a higher dose of dopant than the first halo implant.

Figure 8C:
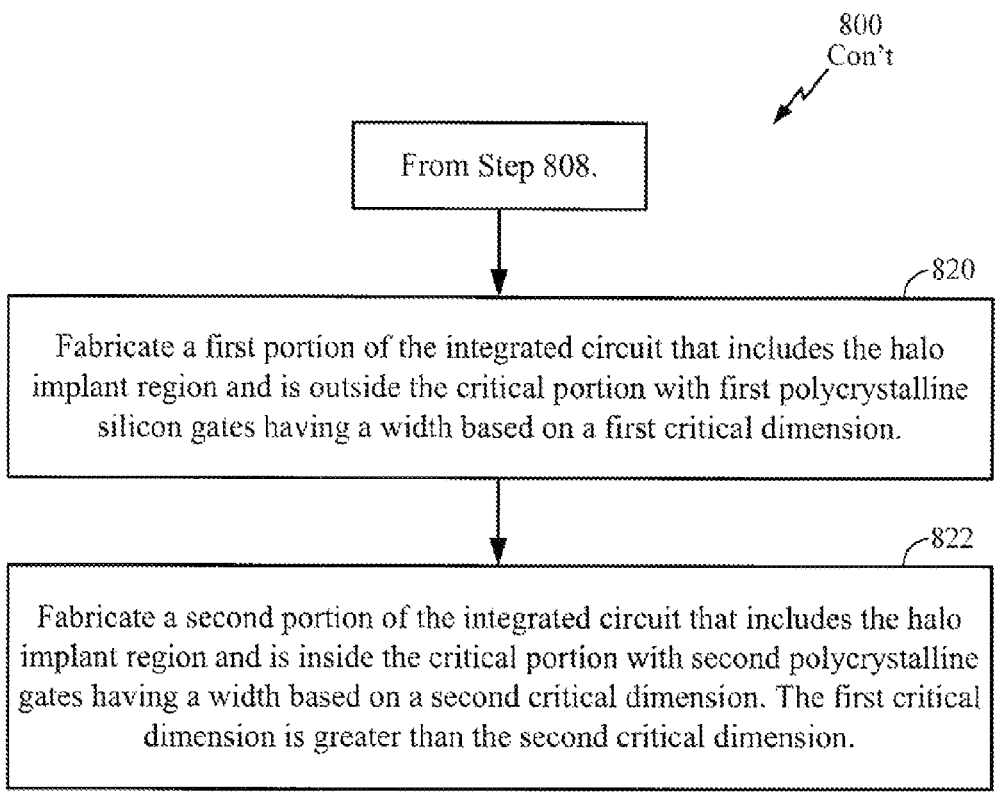

Referring to FIG. 8C, in step 820, a first portion of the integrated circuit that includes the halo implant region and is outside the critical portion is fabricated. The first portion has first polycrystalline silicon gates having a width based on a first critical dimension. In step 822, a second portion of the integrated circuit that includes the halo implant region and is inside the critical portion is fabricated. The second portion has second polycrystalline gates having a width based on a second critical dimension. The first critical dimension is greater than the second critical dimension.

Figure 8D:
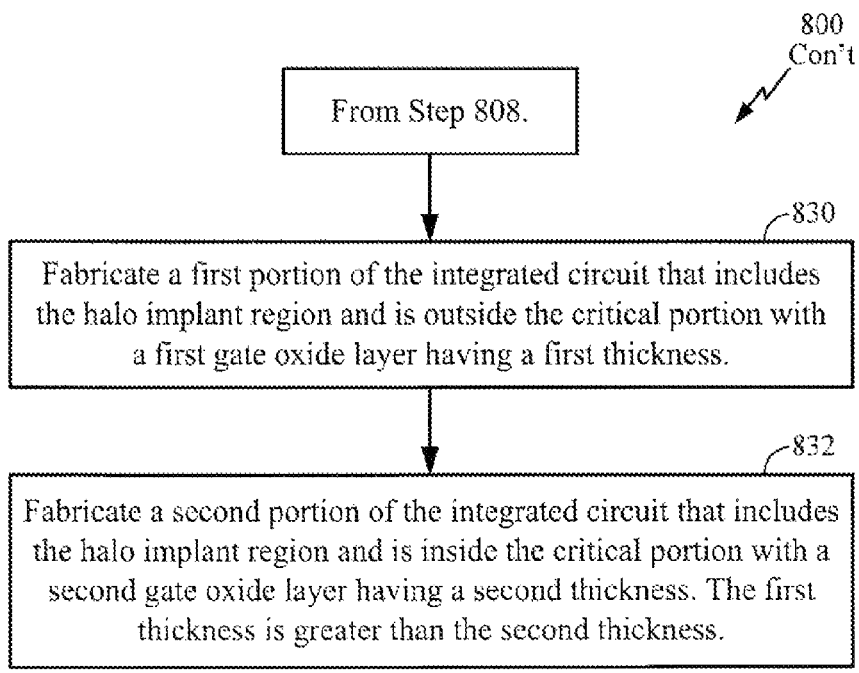

Referring to FIG. 8D, in step 830, a first portion of the integrated circuit that includes the halo implant region and is outside the critical portion is fabricated. The first portion has a first gate oxide layer having a first thickness. In step 832, a second portion of the integrated circuit that includes the halo implant region and is inside the critical portion second is fabricated. The second portion has a gate oxide layer having a second thickness. The first thickness is greater than the second thickness.

Figure 8E:
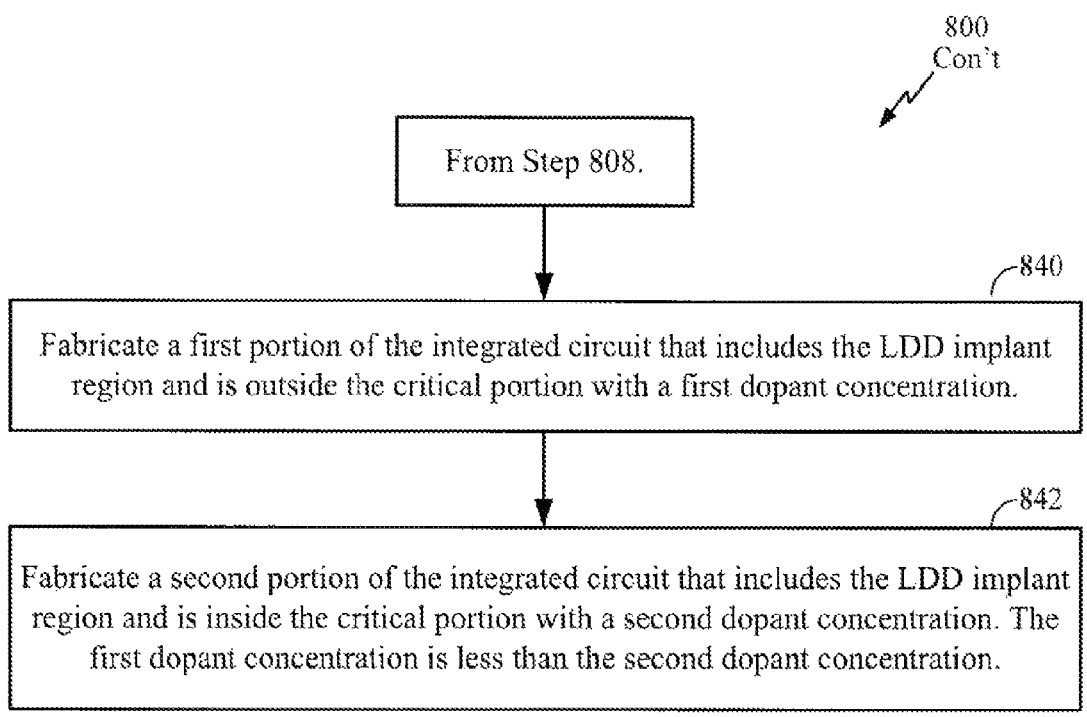

Referring to FIG. 8E, in step 840, a first portion of the integrated circuit that includes the LDD implant region and is outside the critical portion is fabricated. The first portion has a first dopant concentration. In step 842, a second portion of the integrated circuit that includes the LDD implant region and is inside the critical portion is fabricated. The second portion has a second dopant concentration. The first dopant concentration is less than the second dopant concentration.

Figure 8F:
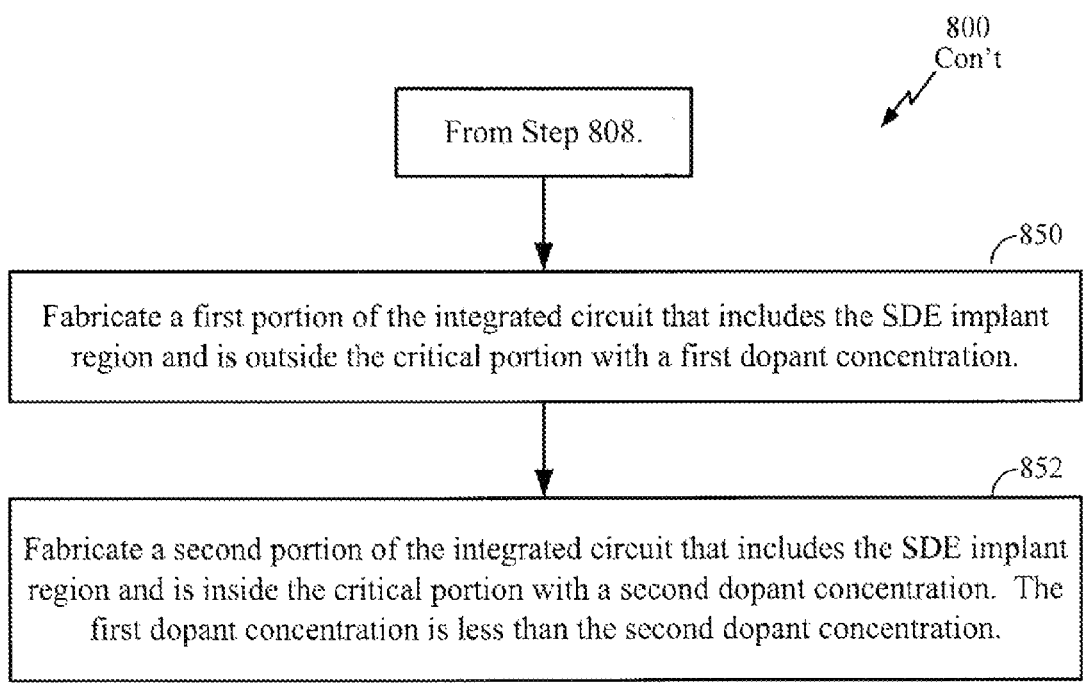

Referring to FIG. 8F, in step 850, a first portion of the integrated circuit that includes the SDE implant region and is outside the critical portion is fabricated. The first portion has a first dopant concentration. In step 852, a second portion of the integrated circuit that includes the SDE implant region and is inside the critical portion is fabricated. The second portion has a second dopant concentration. The first dopant concentration is less than the second dopant concentration.

In some aspects, the teachings herein can be employed in a mobile device capable of supporting communication. For example, the teachings herein can be applied to a mobile device that is configured to use any one (or combinations) of the following technologies: Code Division Multiple Access (CDMA) systems, Multiple-Carrier CDMA (MCCDMA), Wideband CDMA (W-CDMA), High-Speed Packet Access (HSPA, HSPA+) systems, Time Division Multiple Access (TDMA) systems, Frequency Division Multiple Access (FDMA) systems, Single-Carrier FDMA (SC-FDMA) systems, Orthogonal Frequency Division Multiple Access (OFDMA) systems, and other multiple access techniques. A mobile device employing the teachings herein can be designed to implement one or more standards, such as IS-95, cdma2000, IS-856, W-CDMA, TDSCDMA, and other standards. A CDMA network can implement a radio technology such as Universal Terrestrial Radio Access (UTRA), cdma2000, or some other technology. UTRA includes W-CDMA and Low Chip Rate (LCR). The cdma2000 technology covers IS-2000, IS-95 and IS-856 standards. A TDMA network can implement a radio technology such as Global System for Mobile Communications (GSM). An OFDMA network can implement a radio technology such as Evolved UTRA (E-UTRA), IEEE 802.11, IEEE 802.16, IEEE 802.20, Flash-OFDM®, etc. UTRA, E-UTRA, and GSM are part of Universal Mobile Telecommunication System (UMTS). The teachings herein can be implemented in a mobile device that is configured to use a 3GPP Long Term Evolution (LTE) system, an Ultra-Mobile Broadband (UMB) system, and other types of systems. LTE is a release of UMTS that uses E-UTRA. UTRA, E-UTRA, GSM, UMTS and LTE are described in documents from an organization named "3rd Generation Partnership Project" (3GPP), while cdma2000 is described in documents from an organization named "3rd Generation Partnership Project 2" (3GPP2). Although certain aspects of the disclosure can be described using 3GPP terminology, it is to be understood that the teachings herein can be applied to 3GPP (e.g., Re199, Re15, Re16, Re17) technology, as well as 3GPP2 (e.g., 1xRTT, 1xEV-DO RelO, RevA, RevB) technology and other technologies. The techniques can be used in a mobile device that is configured to use emerging and future networks and interfaces.

Those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described herein generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Further, many embodiments are described in terms of sequences of actions to be performed by, for example, elements of a computing device. It will be recognized that various actions described herein can be performed by specific circuits (e.g., application specific integrated circuits (ASICs)), by stored program instructions being executed by one or more processors, or by a combination of both. Additionally, the sequence of actions described herein can be embodied entirely within any form of computer-readable storage medium having stored therein a corresponding set of computer instructions that upon execution cause a processor to perform at least a part of the functions described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

The disclosed devices and methods can be designed and can be configured into GDSII and GERBER computer files, stored on a computer readable media. These files are in turn provided to fabrication handlers who fabricate devices, based on these files, with a lithographic device. The resulting products are semiconductor wafers that are then cut into semiconductor die and packaged into a semiconductor chip. The chips are then employed in devices described herein.

Nothing that is stated or illustrated herein is intended to cause a dedication of any component, step, feature, object, benefit, advantage, or an equivalent to the public, regardless of whether the component, step, feature, object, benefit, advantage, or their equivalent is recited in the claims. While this disclosure describes exemplary embodiments of the invention, it should be noted that various changes and modifications can be made without departing from the scope of the invention as defined by the appended claims.

What is claimed is:

1. A method for selectively improving integrated circuit performance, comprising:
   defining a critical portion of an integrated circuit layout that determines the speed of the integrated circuit;
   identifying at least a part of the critical portion that includes a halo implant region; and
   performing a speed push flow process to increase performance of the part of the critical portion that includes the halo implant region, wherein the speed push flow process further comprises:
      masking a first portion of the integrated circuit that includes the halo implant region and is outside the critical portion;
      implanting a first halo implant in a portion of the integrated circuit that includes the halo implant region and is inside the critical portion;
      masking a second portion of the integrated circuit that includes the halo implant region and is inside the critical portion; and
      implanting a second halo implant in a portion of the integrated circuit that includes the halo implant region and is outside the critical portion,
      wherein the second halo implant receives a higher dose of dopant than the first halo implant.

2. A method for selectively improving integrated circuit performance, comprising:
   defining a critical portion of an integrated circuit layout that determines the speed of the integrated circuit;
   identifying at least a part of the critical portion that includes a halo implant region; and
   performing a speed push flow process to increase performance of the part of the critical portion that includes the halo implant region, wherein the speed push flow process further comprises:
      fabricating a first portion of the integrated circuit that includes the halo implant region and is outside the critical portion with first polycrystalline silicon gates having a width based on a first critical dimension; and
      fabricating a second portion of the integrated circuit that includes the halo implant region and is inside the critical portion with second polycrystalline gates having a width based on a second critical dimension,
      wherein the first critical dimension is greater than the second critical dimension.

3. A method for selectively improving integrated circuit performance, comprising:
   defining a critical portion of an integrated circuit layout that determines the speed of the integrated circuit;
   identifying at least a part of the critical portion that includes a halo implant region; and
   performing a speed push flow process to increase performance of the part of the critical portion that includes the halo implant region, wherein the speed push flow process further comprises:
      fabricating a first portion of the integrated circuit that includes the halo implant region and is outside the critical portion with a first gate oxide layer having a first thickness; and
      fabricating a second portion of the integrated circuit that includes the halo implant region and is inside the critical portion second with a second gate oxide layer having a second thickness,
      wherein the first thickness is greater than the second thickness.

4. A method for selectively improving integrated circuit performance, comprising:
   defining a critical portion of an integrated circuit layout that determines the speed of the integrated circuit;
   identifying at least a part of the critical portion that includes a lightly doped drain (LDD) implant region; and
   performing a speed push flow process to increase performance of the part of the critical portion that includes the LDD implant region,
   wherein the speed push flow process comprises:
      fabricating a first portion of the integrated circuit that includes the LDD implant region and is outside the critical portion with a first dopant concentration; and
      fabricating a second portion of the integrated circuit that includes the LDD implant region and is inside the critical portion with a second dopant concentration,
      wherein the first dopant concentration is less than the second dopant concentration.

5. A method for selectively improving integrated circuit performance, comprising:
   defining a critical portion of an integrated circuit layout that determines the speed of the integrated circuit;
   identifying at least a part of the critical portion that includes a source drain extension (SDE) implant region; and
   performing a speed push flow process to increase performance of the part of the critical portion that includes the SDE implant region,
   wherein the speed push flow process further comprises:

fabricating a first portion of the integrated circuit that includes the SDE implant region and is outside the critical portion with a first dopant concentration; and
fabricating a second portion of the integrated circuit that includes the SDE implant region and is inside the critical portion with a second dopant concentration,
wherein the first dopant concentration is less than the second dopant concentration.

6. An apparatus for selectively improving integrated circuit performance, comprising:
means for defining a critical portion of an integrated circuit layout that determines the speed of the integrated circuit;
means for identifying at least a part of the critical portion that includes a halo implant region; and
means for performing a speed push flow process to increase performance of the part of the critical portion that includes the halo implant region, comprising:
means for masking a first portion of the integrated circuit that includes the halo implant region and is outside the critical portion;
means for implanting a first halo implant in the portion of the integrated circuit that includes the halo implant region and is inside the critical portion;
means for masking a second portion of the integrated circuit that includes the halo implant region and is inside the critical portion; and
means for implanting a second halo implant in the portion of the integrated circuit that includes the halo implant region and is outside the critical portion,
wherein the second halo implant receives a higher dose of dopant than the first halo implant.

7. An apparatus for selectively improving integrated circuit performance, comprising:
means for defining a critical portion of an integrated circuit layout that determines the speed of the integrated circuit;
means for identifying at least a part of the critical portion that includes a halo implant region; and
means for performing a speed push flow process to increase performance of the part of the critical portion that includes the halo implant region, comprising:
means for fabricating a first portion of the integrated circuit that includes the halo implant region and is outside the critical portion with first polycrystalline silicon gates having a width based on a first critical dimension; and
means for fabricating a second portion of the integrated circuit that includes the halo implant region and is inside the critical portion with second polycrystalline gates having a width based on a second critical dimension,
wherein the first critical dimension is greater than the second critical dimension.

8. An apparatus for selectively improving integrated circuit performance, comprising:
means for defining a critical portion of an integrated circuit layout that determines the speed of the integrated circuit;
means for identifying at least a part of the critical portion that includes a halo implant region; and
means for performing a speed push flow process to increase performance of the part of the critical portion that includes the halo implant region, comprising:
means for fabricating a first portion of the integrated circuit that includes the halo implant region and is outside the critical portion with a first gate oxide layer having a first thickness; and
means for fabricating a second portion of the integrated circuit that includes the halo implant region and is inside the critical portion second with a gate oxide layer having a second thickness,
wherein the first thickness is greater than the second thickness.

9. An apparatus for selectively improving integrated circuit performance, comprising:
means for defining a critical portion of an integrated circuit layout that determines the speed of the integrated circuit;
means for identifying at least a part of the critical portion that includes a lightly doped drain (LDD) implant region; and
means for performing a speed push flow process to increase performance of the part of the critical portion that includes the LDD implant region,
wherein the means for performing the speed push flow process comprises:
means for fabricating a first portion of the integrated circuit that includes the LDD implant region and is outside the critical portion with a first dopant concentration; and
means for fabricating a second portion of the integrated circuit that includes the LDD implant region and is inside the critical portion with a second dopant concentration,
wherein the first dopant concentration is less than the second dopant concentration.

10. An apparatus for selectively improving integrated circuit performance, comprising:
means for defining a critical portion of an integrated circuit layout that determines the speed of the integrated circuit;
means for identifying at least a part of the critical portion that includes a source drain extension (SDE) implant region; and
means for performing a speed push flow process to increase performance of the part of the critical portion that includes the SDE implant region,
wherein the means for performing the speed push flow process comprises:
means for fabricating a first portion of the integrated circuit that includes the SDE implant region and is outside the critical portion with a first dopant concentration; and
means for fabricating a second portion of the integrated circuit that includes the SDE implant region and is inside the critical portion with a second dopant concentration,
wherein the first dopant concentration is less than the second dopant concentration.

11. A non-transitory computer-readable medium, comprising instructions stored thereon that, if executed by a lithographic device, cause the lithographic device to perform at least a part of a method, comprising:
defining a critical portion of an integrated circuit layout that determines a speed of an integrated circuit;
identifying at least a part of the critical portion that includes a lightly doped drain (LDD) implant region; and
performing a speed push flow process on the part of the critical portion that includes the LDD implant region,
wherein the speed push flow process comprises:
fabricating a first portion of the integrated circuit that includes the LDD implant region and is outside the critical portion with a first dopant concentration; and
fabricating a second portion of the integrated circuit that includes the LDD implant region and is inside the critical portion with a second dopant concentration, wherein the first dopant concentration is less than the second dopant concentration.

12. A non-transitory computer-readable medium, comprising instructions stored thereon that, if executed by a lithographic device, cause the lithographic device to perform at least a part of a method, comprising:
 defining a critical portion of an integrated circuit layout that determines the speed of the integrated circuit;
 identifying at least a part of the critical portion that includes a halo implant region; and
 performing a speed push flow process to increase performance of the part of the critical portion that includes the halo implant region, wherein the speed push flow process further comprises:
  masking a first portion of the integrated circuit that includes the halo implant region and is outside the critical portion;
  implanting a first halo implant in a portion of the integrated circuit that includes the halo implant region and is inside the critical portion;
  masking a second portion of the integrated circuit that includes the halo implant region and is inside the critical portion; and
  implanting a second halo implant in a portion of the integrated circuit that includes the halo implant region and is outside the critical portion,
  wherein the second halo implant receives a higher dose of dopant than the first halo implant.

13. A non-transitory computer-readable medium, comprising instructions stored thereon that, if executed by a lithographic device, cause the lithographic device to perform at least a part of a method, comprising:
 defining a critical portion of an integrated circuit layout that determines the speed of the integrated circuit;
 identifying at least a part of the critical portion that includes a halo implant region; and
 performing a speed push flow process to increase performance of the part of the critical portion that includes the halo implant region, wherein the speed push flow process further comprises:
  fabricating a first portion of the integrated circuit that includes the halo implant region and is outside the critical portion with first polycrystalline silicon gates having a width based on a first critical dimension; and
  fabricating a second portion of the integrated circuit that includes the halo implant region and is inside the critical portion with second polycrystalline gates having a width based on a second critical dimension,
  wherein the first critical dimension is greater than the second critical dimension.

14. A non-transitory computer-readable medium, comprising instructions stored thereon that, if executed by a lithographic device, cause the lithographic device to perform at least a part of a method, comprising:
 defining a critical portion of an integrated circuit layout that determines the speed of the integrated circuit;
 identifying at least a part of the critical portion that includes a halo implant region; and
 performing a speed push flow process to increase performance of the part of the critical portion that includes the halo implant region, wherein the speed push flow process further comprises:
  fabricating a first portion of the integrated circuit that includes the halo implant region and is outside the critical portion with a first gate oxide layer having a first thickness; and
  fabricating a second portion of the integrated circuit that includes the halo implant region and is inside the critical portion second with a second gate oxide layer having a second thickness,
  wherein the first thickness is greater than the second thickness.

15. A non-transitory computer-readable medium, comprising instructions stored thereon that, if executed by a lithographic device, cause the lithographic device to perform at least a part of a method, comprising:
 defining a critical portion of an integrated circuit layout that determines a speed of an integrated circuit;
 identifying at least a part of the critical portion that includes a source drain extension (SDE) implant region; and
 performing a speed push flow process on the part of the critical portion that includes the SDE implant region, wherein the speed push flow process comprises:
  fabricating a first portion of the integrated circuit that includes the SDE implant region and is outside the critical portion with a first dopant concentration; and
  fabricating a second portion of the integrated circuit that includes the SDE implant region and is inside the critical portion with a second dopant concentration,
  wherein the first dopant concentration is less than the second dopant concentration.

\* \* \* \* \*